United States Patent
Yamamoto et al.

(10) Patent No.: US 6,652,993 B2
(45) Date of Patent: Nov. 25, 2003

(54) COOPER CLAD LAMINATE WITH COOPER-PLATED CIRCUIT LAYER, AND METHOD FOR MANUFACTURING PRINTED WIRING BOARD USING THE COPPER CLAD LAMINATE WITH COOPER-PLATED CIRCUIT LAYER

(75) Inventors: Takuya Yamamoto, Ageo (JP); Takashi Syoujiguchi, Ageo (JP)

(73) Assignee: Mitsui Mining & Smelting Co., Ltd., Tokyo (JP)

(*) Notice: Subject to any disclaimer, the term of this patent is extended or adjusted under 35 U.S.C. 154(b) by 0 days.

(21) Appl. No.: 10/131,222

(22) Filed: Apr. 25, 2002

(65) Prior Publication Data

US 2002/0182434 A1 Dec. 5, 2002

(30) Foreign Application Priority Data

May 31, 2001 (JP) ......................................... 2001-163743

(51) Int. Cl.[7] .............................. B32B 15/01; C23F 1/00
(52) U.S. Cl. ....................... 428/675; 428/209; 428/212; 428/217; 428/901; 216/13; 216/105; 216/106; 216/108
(58) Field of Search ................................ 428/621, 637, 428/674, 675, 209, 212, 217, 901; 216/13, 83, 96, 100, 105, 106, 108

(56) References Cited

U.S. PATENT DOCUMENTS

| | | | | |
|---|---|---|---|---|
| 4,806,200 A | * | 2/1989 | Larson et al. | 216/18 |
| 5,544,773 A | * | 8/1996 | Haruta et al. | 216/13 |
| 6,187,416 B1 | * | 2/2001 | Satoh et al. | 428/209 |
| 6,212,769 B1 | * | 4/2001 | Boyko et al. | 29/852 |

FOREIGN PATENT DOCUMENTS

JP             402025090a    * 1/1990

* cited by examiner

Primary Examiner—Deborah Jones
Assistant Examiner—Stephen Stein
(74) Attorney, Agent, or Firm—Rothwell Figg Ernst & Manbeck

(57) ABSTRACT

The object of the present invention is to provide a copper clad laminate with a copper-plated circuit layer, and a method for manufacturing a printed wiring board that excels the conventional ones in the aspect ratio of a circuit pattern when processed to a printed wiring board comprising a fine-pitch circuit. The object of the present invention is achieved by manufacturing a printed wiring board with the use of a copper clad laminate with a copper-plated circuit layer characterized by a copper-plated circuit layer and an outer-layer copper foil layer that satisfied the relationship in a case where a specific etchant is used, the R v value (Vsc/Vsp), which is the ratio of the dissolution rate (Vsp) of deposited copper that constitutes said copper-plated circuit layer to the dissolution rate (Vsc) of copper that constitutes said outer-layer copper foil layer, is 1.0 or more.

4 Claims, 6 Drawing Sheets

(a) Schematic sectional view of circuit obtained according to the present invention Etching factor $(2h/(L2 - L1))$ becomes large (b) Schematic sectional view of circuit obtained according to a conventional method Etching factor $(2h/(L2 - L1))$ becomes small (a)

(b)

(c)

(d)

(e)

(f)

COOPER CLAD LAMINATE WITH COOPER-PLATED CIRCUIT LAYER, AND METHOD FOR MANUFACTURING PRINTED WIRING BOARD USING THE COPPER CLAD LAMINATE WITH COOPER-PLATED CIRCUIT LAYER

TECHNICAL FIELD

The present invention relates to a copper clad laminate with a copper-plated circuit layer, and a method for manufacturing a printed wiring board using the copper clad laminate with the copper-plated circuit layer.

BACKGROUND ART

On manufacturing a printed wiring board comprising a fine circuit, it has been desired that the aspect ratio of the formed circuit is satisfactory. That is, the shape when the circuit is observed from the cross section is generally so-called trapezoidal, and if the upper end portion is narrower than the lower end portion, the aspect ratio becomes poor. A smaller width of the upper end portion means that the part mounting area is narrow, so that the difficulty of mounting operations redoubles.

Therefore, as a means to obtain a printed wiring board comprising a fine-pitch circuit that excels in the aspect ratio, the manufacture of a printed wiring board that adopts a so-called semi-additive method has been carried out.

In the semi-additive method as referred to here, (1) the surface of an outer-layer copper foil is exposed on the surface of a copper foil positioned on the outer layer of a copper clad laminate, by separating and removing the plating resist from the portion whereon a circuit is formed through processes of exposing and developing with the use of the plating resist, leaving only the plating resist of the portion whereon no circuits are formed on the outer-layer copper foil. Then, (2) by plating copper on the surface, the plating resist is separated and removed, and a copper-plated circuit layer is formed on the exposed surface of the outer-layer copper foil, to form a circuit pattern. (3) When plating is completed, remaining plating resist is separated, and the copper foil present on the bottom portion between the formed circuits is dissolved and removed by flush etching to complete a printed wiring board. The printed wiring boards having thus formed fine-pitch circuits have been supplied to the market.

However, in the semi-additive method as described above, when the copper foil layer is removed through flush etching, the upper edge portion of the copper-plated circuit layer is simultaneously eroded, the circuit pattern of the printed wiring board, which is the end product, is deteriorated, and the poor aspect ratio of the cross-sectional shape of the circuit has been unavoidable.

Therefore, a method for manufacturing a copper clad laminate and a printed wiring board that excels the conventional ones in the aspect ratio of the circuit pattern when processed to a printed wiring board has been demanded.

SUMMARY OF THE INVENTION

The inventors of the present invention conducted intensive studies, and found that the above problems could be solved by designing a copper clad laminate considering the characteristics of a copper foil for laying on the copper clad laminate, and the copper-plated circuit layer formed thereon. That is, by paying attention to difference in dissolution rates to an etchant between the copper-plated circuit layer and the copper foil layer, a certain level or more of difference in dissolution rates was produced between the two, and by using a specific etchant, a high-quality printed wiring board that could not be obtained by prior art could be manufactured using a semi-additive method.

In the claim, there is described a copper clad laminate comprising a copper-plated circuit layer for manufacturing a printed wiring board by a semi-additive method, the copper clad laminate with a copper-plated circuit layer characterized by comprising a copper-plated circuit layer and an outer-layer copper foil layer that satisfied the relationship wherein, when a specific etchant is used, the Rv value (Vsc Vsp), which is the ratio of the dissolution rate (Vsp) of deposited copper that constitutes said copper-plated circuit layer to the dissolution rate (Vsc) of copper that constitutes said outer-layer copper foil layer, is 1.0 or more.

Figure 1:
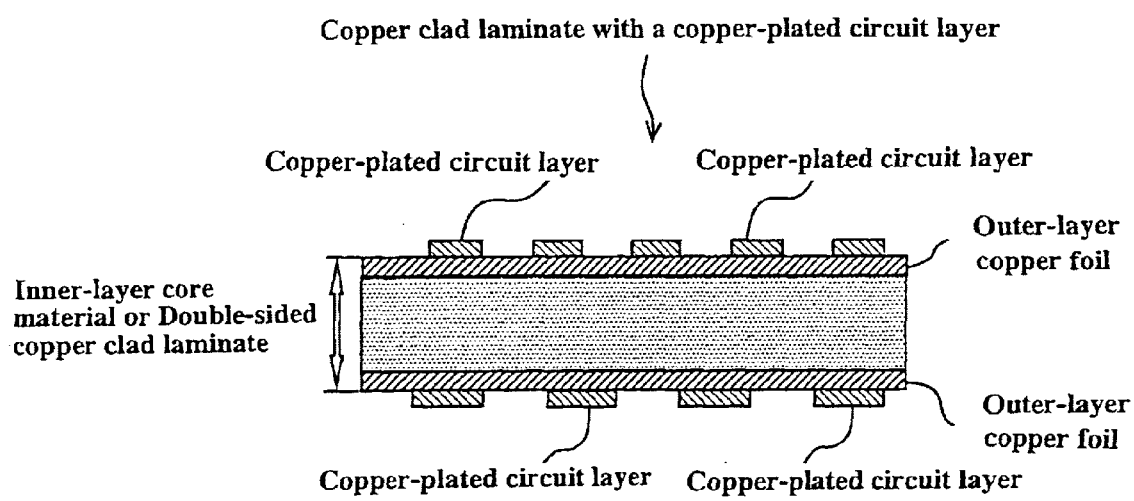
FIG. 1 shows a schematic sectional view of a copper clad laminate with a copper-plated circuit layer so called in the present invention.

FIG. 1 shows a schematic cross section of the copper clad laminate with a copper-plated circuit layer. The copper clad laminate with a copper-plated circuit layer means the state when the processes to the step (2) of the above-described conventional semi-additive method have been completed.

As described in the claim, if a copper clad laminate with a copper-plated circuit layer has the Rv value (Vsc/Vsp), which is the ratio of the dissolution rate (Vsp) of deposited copper that constitutes said copper-plated circuit layer to the dissolution rate (Vsc) of copper that constitutes said outer-layer copper foil layer, is 1.0 or more, then the erosion of the upper edge portion of the copper-plated circuit layer is prevented when the copper foil layer is removed by flush etching in the following step, and the deterioration of the circuit pattern of the printed wiring board, which is the end product, can be avoided.

Figure 2:
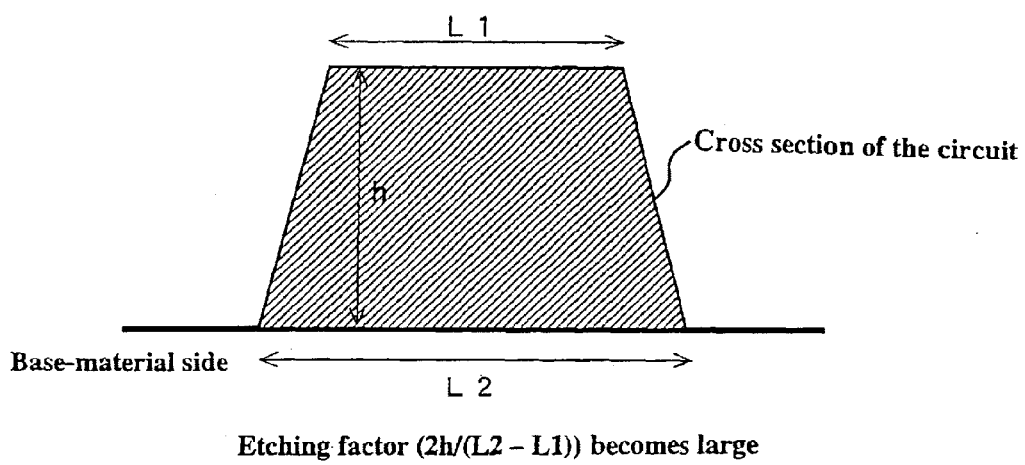
FIG. 2 shows a diagram for schematically comparing and illustrating difference in the sectional shape of the circuit obtained by the present invention and the sectional shape of the circuit obtained by a conventional method.
Figure 2:
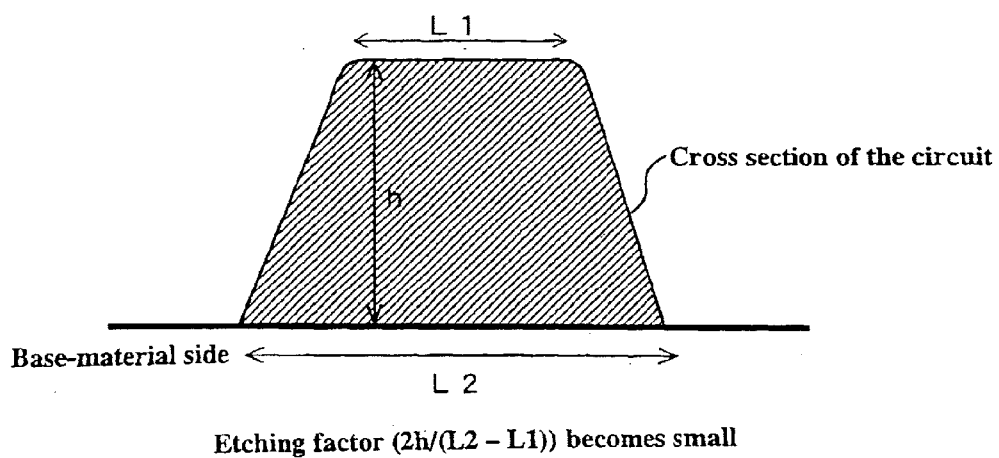

That is, in the conventional method as FIG. 2(b) shows, the edge portions on the upper portion of the cross section of the formed circuit is eroded, and the corners are rounded. As a result, the flat region on the upper portion of the circuit is narrowed. Whereas, the use of the copper clad laminate with the copper-plated circuit layer prevents the erosion of the edge portions on the upper portion of the cross section of the formed circuit, and sharp corners as FIG. 2(c) shows remain intact. As a result, since the flat region on the upper portion of the circuit is widened, the initially designed circuit width can be achieved easily, and finishing accuracy becomes favorable. Moreover, the connecting area for mounting the parts is widened, and process control if facilitated.

In this time, unless the dissolution rate (Vsp) of the deposited copper constituting the copper-plated circuit layer is slower than the dissolution rate (Vsc) of the copper constituting the above-described outer-layer copper foil layer, the object cannot be achieved obviously. Furthermore, strictly speaking, the dissolution rate differs depending on the type of the etchant. Also, the type of the etchant determines whether difference between Vsp and Vsc is large or not.

In other words, an etchant that cannot make difference between Vsp and Vsc large cannot be used, but it can be said that any etchant that can make difference between Vsp and Vsc large can be used. And the Rv value (Vsc/Vsp) must be the value of 1.0 or more. As the results of repeated examinations, it was found that if the Rv value is less than 1.0, the erosion of the copper-plated circuit layer portion increases, and the aspect ratio of the cross section of the circuit begins changing steeply. Therefore, as a matter of course, the larger difference enables the erosion of the copper-plated circuit layer to be prevented in the flush etching of the above-described semi-additive method. Thus, in the present invention, the claim uses the expression of "when a specific etchant is used" is used. This etchant will be described in detail below in the description of the manufacturing method.

Figure 3:
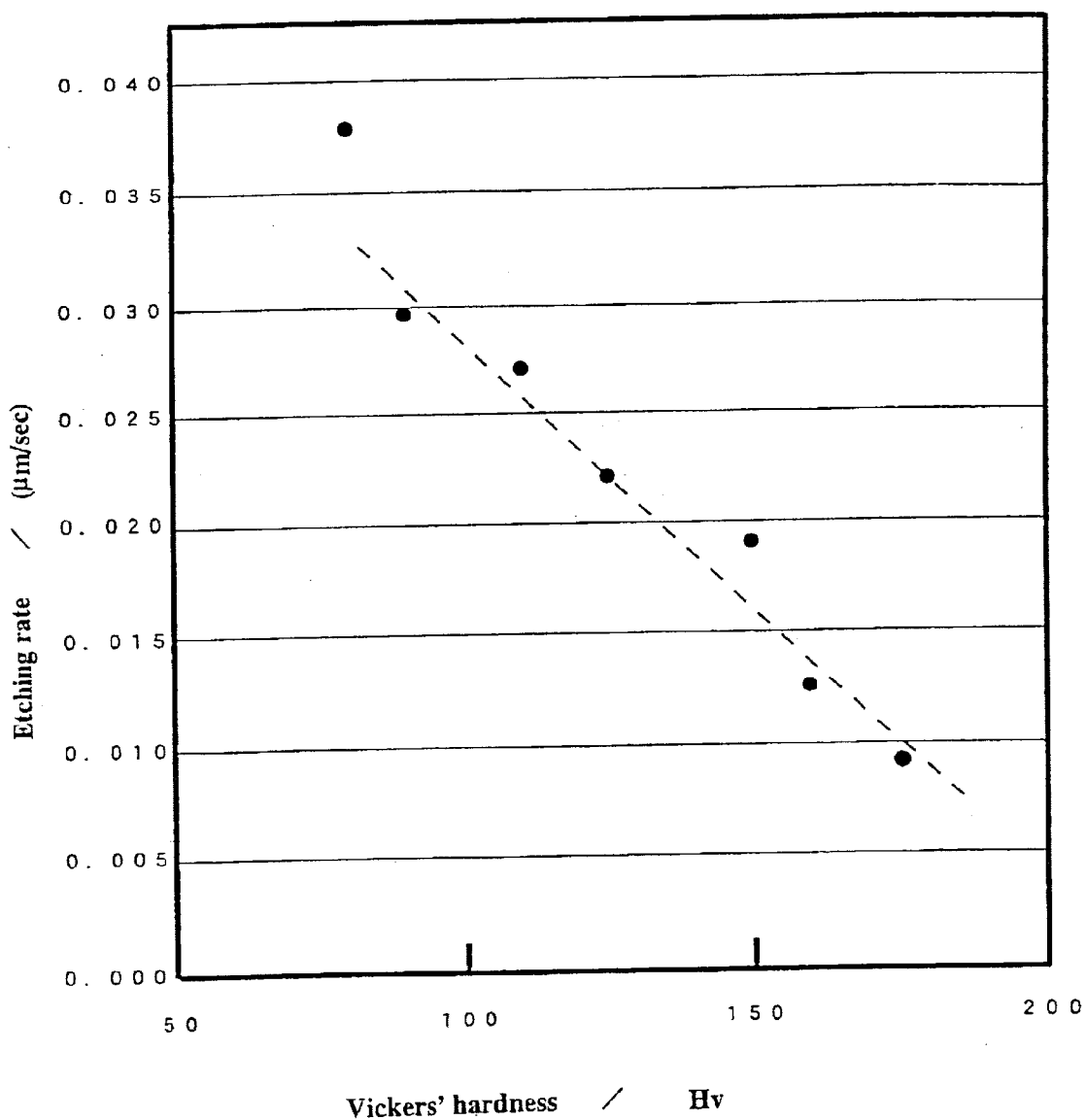
FIG. 3 shows diagrams showing the relationship between the dissolution rate and the hardness of copper.

It is obvious that to measure the dissolution rate to the above-described etchants for every product lot is troublesome, and consumes considerable time for testing. Therefore, the present inventors examined the presence of properties, factors, or the like that have correlation with the dissolution rate. As a result, it was found that the dissolution rate of copper has a very close correlation with the hardness of copper. The relationship is shown in FIG. 3. As is obvious from FIG. 3, the higher the hardness of copper, the lower the dissolution rate to the etchant. The theoretical basis for this has not been clarified at the present stage.

Therefore, in the claim, there is described that, in a copper clad laminate comprising a copper-plated circuit layer for manufacturing a printed wiring board by a semi-additive method, a copper clad laminate with a copper-plated circuit layer characterized in comprising a copper-plated circuit layer and an outer-layer copper foil layer that satisfied the relationship wherein, when a specific etchant is used, the Rhv value (Hvc/Hvp), which is the ratio of the Vickers' hardness (Hvp) of deposited copper that constitutes said copper-plated circuit layer to the dissolution rate (Hvc) of copper that constitutes said outer-layer copper foil layer, is 1.0 or less.

Here, the present inventors found, as the result of substituting the range where the above-described Rv value (Vsc/Vsp) is 1.0 or more with the value of Vickers' hardness, that it is enough if the relationship wherein the Rhv value (Hvc/Hvp), which is the ratio of the Vickers' hardness (Hvp) of deposited copper that constitutes the copper-plated circuit layer to the Vickers' hardness (Hvc) of copper that constitutes said outer-layer copper foil layer, is 1.0 or less is satisfied.

Now, the etchant will be described. The present inventors used various solutions as the etchants in studying the above-described dissolution rate of copper. Typically, they were copper-chloride-based, iron-chloride-based, sulfuric acid/hydrogen peroxide-based solutions, and the like. Since there were cases to use additives that can be considered as a common sense in combination, the expression of ". . . -base" was used.

As a result, it was known that only any of copper-chloride-based, iron-chloride-based, and sulfuric acid/hydrogen peroxide-based solutions significantly changes the dissolution rate corresponding to the characteristics of copper. This in turn means that the dissolution rate during etching can be controlled if the characteristics of copper are controlled. Therefore, the present inventors considered the use of a copper-chloride-based, iron-chloride-based, or sulfuric acid/hydrogen peroxide-based solution as the etchant for flush etching when a printed wiring board comprising a fine-pitch circuit was manufactured using a copper clad laminate with a copper-plated circuit layer according to claim 1 or claim 2 by a semi-additive method.

Therefore, in the claim, there is described that, in a method for manufacturing a printed wiring board by a semi-additive method using the copper clad laminate with a copper-plated circuit layer according to preceding claims, a method for manufacturing a printed wiring board characterized in that, as an etchant used in flush etching for etching off the outer-layer copper foil layer at areas on which surface the copper-plated circuit layer is not formed and is exposed, any of copper-chloride-based, iron-chloride-based, or sulfuric acid/hydrogen peroxide-based copper etchants is employed.

BEST MODE FOR CARRYING OUT THE INVENTION

The embodiment of the present invention will be described below. In this embodiment, a copper clad laminate with a copper-plated circuit layer was manufactured, and subjecting the copper clad laminate with a copper-plated circuit layer to the flush etching to manufacture a printed wiring board. Then, the cross-sectional shape of the formed circuit was observed.

Figure 4:
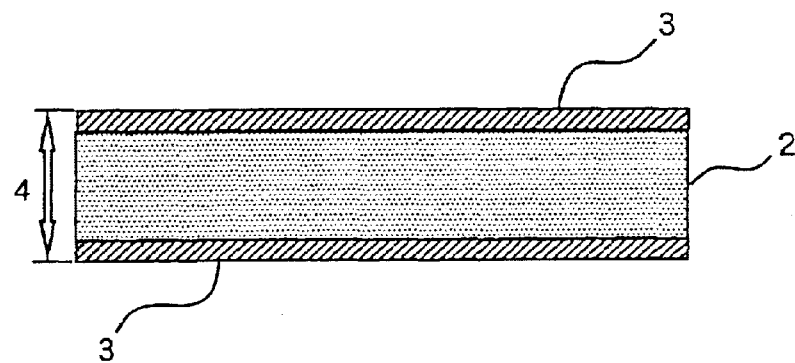
FIGS. 4 to 6 show schematic diagrams representing the manufacturing flow of a printed wiring board.
Figure 4:
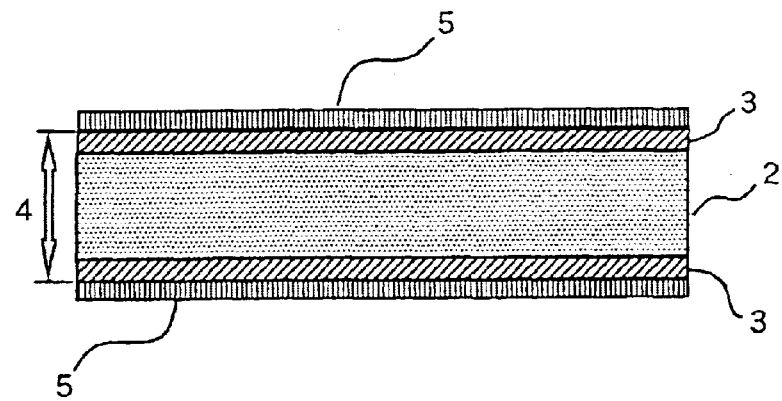
Figure 5:
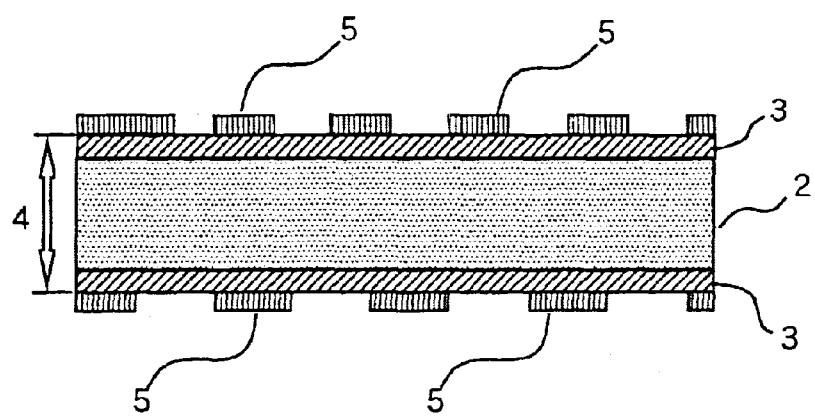
Figure 5:
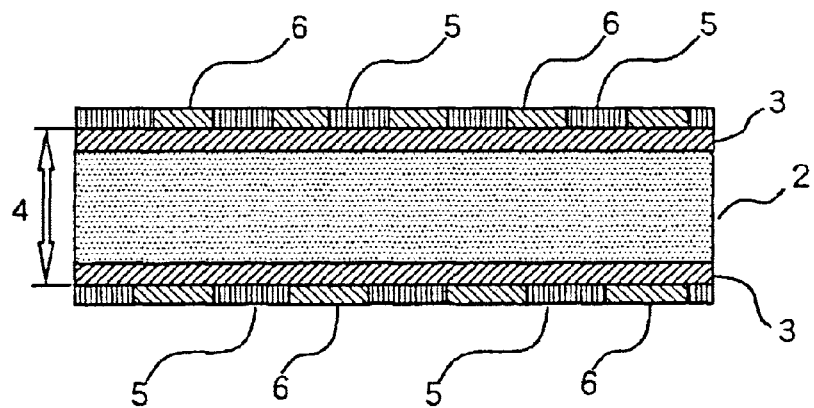
Figure 6:
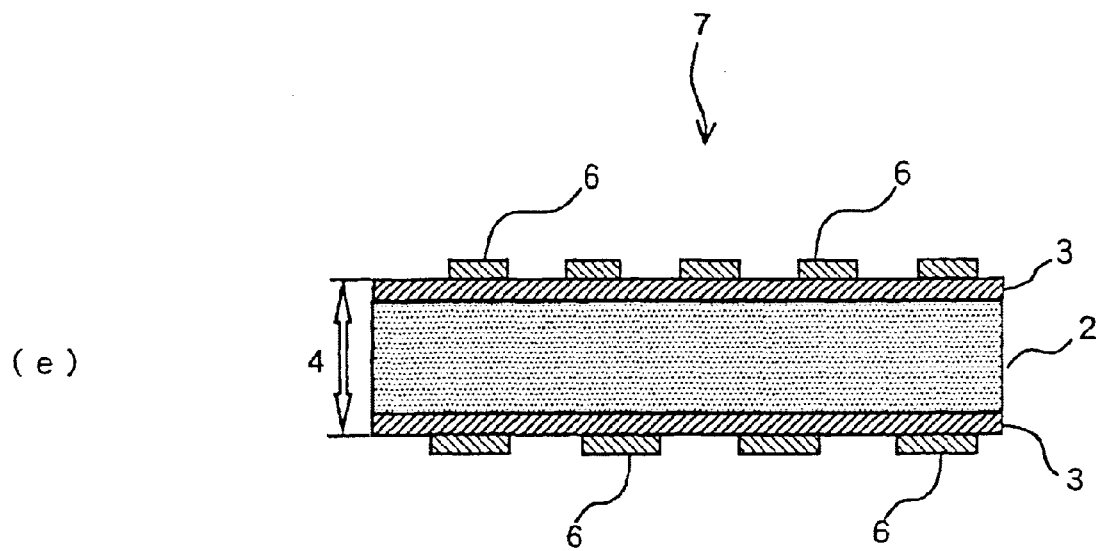
Figure 6:
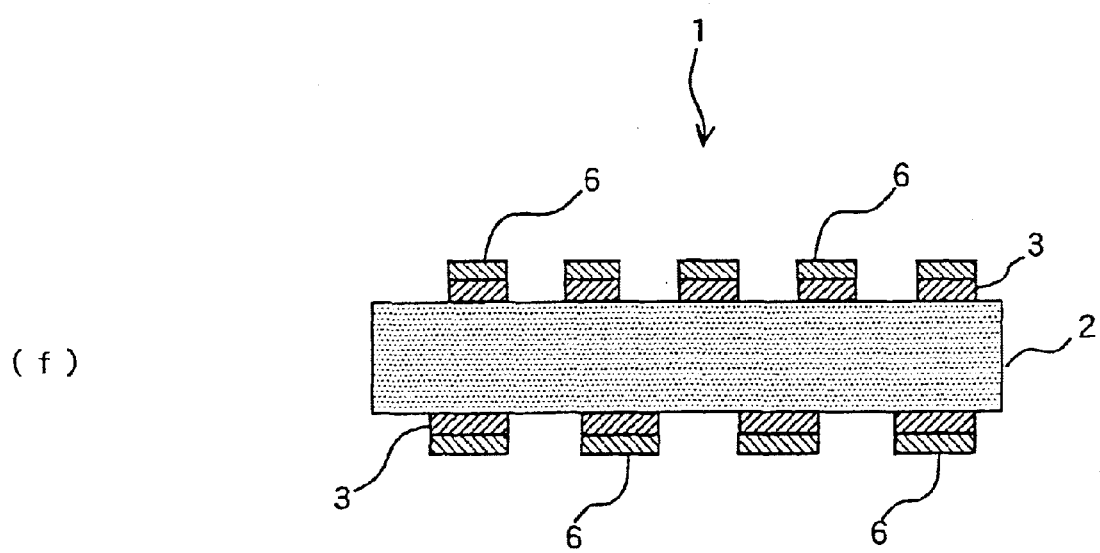

In this embodiment, as a most simplified case, a double-sided printed wiring board was manufactured using a semi-additive method. The embodiment will be described below with reference to the manufacturing flow shown in FIGS. 4 to 6. Therefore, here, a double-sided copper clad laminate 4, wherein electrodeposited copper foils 3 each having a nominal thickness of 5 μm were laid on the both surfaces of FR-4 prepreg 2 shown in FIG. 4(a) as the outer layers, was used. First, as FIG. 4(b) shows, plating resist layers 5 were formed on the both surfaces of the electrodeposited copper foils 3 laid on the outer layers of the double-sided copper clad laminate 4. As the plating resist layers 5, dry films (positive type), each having a thickness of 25 μm, were compressed with heated rollers with the use of a dry-film laminator.

Then, photo-mask films corresponding to the circuit pattern to be formed were placed on the plating resist layers 5 formed on the surfaces of the outer-layer copper foils, and exposed to UV radiation. The UV dose at this time was about 40 mJ/cm$^2$. Here, since a positive-type dry film, which has an exposure resolution superior to that of a so-called negative-type dry film, the portions of the plating resist layers 5 exposed to UV radiation were dissolved during developing, and the portions of the plating resist layers 5 not exposed to UV radiation were left after developing.

After the completion of exposure, developing was performed. As the developer, a 1-wt % sodium hydroxide solution containing a surfactant was used. As a result of developing, in the following copper plating process, the state wherein the plating resist layers 5 on the portion to form the circuit were separated and removed, the surfaces of the outer layer copper foils were exposed, and only the plating resist layers 5 on the portion not to form the circuit were left, was produced. This state is shown in the schematic sectional view of FIG. 5(c).

Then, electrolysis was conducted in a copper plating solution with the use of the outer-layer copper foil layer 3 of the developed double-sided copper clad laminate 4 as the cathode, and copper was deposited on the exposed surface portions of the outer-layer copper foil wherefrom the plating resist layers 5 had been separated and removed, to form the copper-plated circuit layer 6 of a thickness of about 20 μm of a circuit pattern. This state is shown in the schematic sectional view of FIG. 5(d). Furthermore, the remaining plating resist layers 5 was swollen and separated using a sodium hydroxide solution, to form a copper clad laminate with a copper-plated circuit layer 7 having a cross section shown in the schematic sectional view of FIG. 6(e).

The copper clad laminate with a copper-plated circuit layer 7 having a cross section shown in the schematic sectional view of FIG. 6(e) was flush-etched using a solution containing 40 m/l of sulfuric acid and 32 m/l of hydrogen peroxide of a liquid temperature of 30° C. as the etchant. As a result, a double-sided printed wiring board 1 of a cross section shown in the schematic sectional view of FIG. 6(f) was obtained.

When the circuit pattern of thus obtained double-sided printed wiring board was observed from the cross section thereof, it was clearly found that the erosion of the edge portion of the copper-plated circuit layer 6 that constituted the upper portion of the cross section of the circuit was prevented, and a sharp corner was left. Also, the observed cross-sectional shape of the circuit was a substantially perfect square.

INDUSTRIAL APPLICABILITY

The circuit of a printed wiring board obtained with the use of a copper clad-laminate with a copper-plated circuit layer according to the present invention through the manufacturing method according to the present invention can possess a cross-sectional shape having a very excellent aspect ratio, can easily obtain the circuit width as designed, and excels in finishing accuracy in the level that cannot be obtained by prior art. Moreover, it becomes possible to secure a large part mounting area for mounting parts, to reduce the costs for process control, and to contribute to the reduction of total manufacturing costs.

What is claimed is:

1. A copper clad laminate with a copper-plated circuit layer, comprising a copper plated circuit layer for manufacturing a printed wiring board through a semi-additive method, wherein the copper clad laminate and an outer-layer copper foil layer that satisfied the relationship in a case where a specific etchant is used, the Rv value (Vsc/Vsp), which is the ratio of the dissolution rate (Vsp) of deposited copper that constitutes said copper-plated circuit layer to the dissolution rate (Vsc) of the copper that constitutes said outer-layer copper foil layer, is more than 1.0, wherein the specific etchant is selected from the group comprising copper-chloride-based, iron-chloride-based and sulfuric acid/hydrogen peroxide-based solutions.

2. A copper clad laminate with a copper-plated circuit layer, comprising a copper plated circuit layer for manufacturing a printed wiring board through a semi-additive method, wherein the copper clad laminate comprises a copper-plated circuit layer and an outer-layer copper foil layer that satisfied the relationship in a case where a specific etchant is used, the Rhv value (Hvc/Hvp), which is the ratio of the Vickers' hardness (Hvp) of deposited copper that constitutes said copper-plated circuit layer to the Vickers' hardness (Hvc) of the copper that constitutes said outer-layer copper foil layer, is less than 1.0, wherein the specific etchant is selected from the group comprising copper-chloride-based, iron-chloride-based and sulfuric acid/hydrogen peroxide-based solutions.

3. A method for manufacturing a printed wiring board with the use of a copper clad laminate with a copper-plated circuit layer through a semi-additive method, said copper clad laminate defined in claim 1, wherein, as an etchant used in flush etching for etching off the outer-layer copper foil layer at areas on which surface the copper-plated circuit layer is not formed and is exposed, any of copper-chloride-based, iron-chloride-based, or sulfuric acid/hydrogen peroxide-based copper etchants is employed.

4. A method of manufacturing a printed wiring board with the use of a copper clad laminate with a copper-plated circuit layer through a semi-additive method, said copper clad laminate defined in claim 2, wherein, as an etchant used in flush etching for etching off the outer-layer copper foil layer at areas on which surface the copper-plated circuit layer is not formed and is exposed, any of copper-chloride-based, iron-chloride-based, or sulfuric acid/hydrogen peroxide-based copper etchants is employed.

* * * * *